Nov. 8, 1966

D. C. BAILEY 3,284,713

EMITTER COUPLED HIGH FREQUENCY AMPLIFIER

Filed March 26, 1963

2 Sheets-Sheet 1

INVENTOR.
Dean C. Bailey

BY Mueller & Aichele

ATTY'S.

Nov. 8, 1966 D. C. BAILEY 3,284,713

EMITTER COUPLED HIGH FREQUENCY AMPLIFIER

Filed March 26, 1963 2 Sheets-Sheet 2

INVENTOR.
Dean C. Bailey
BY
Mueller & Aichele
ATTY'S.

United States Patent Office 3,284,713

Patented Nov. 8, 1966

3,284,713

EMITTER COUPLED HIGH FREQUENCY AMPLIFIER

Dean C. Bailey, Scottsdale, Ariz., assignor to Motorola, Inc., Franklin Park, Ill., a corporation of Illinois Filed Mar. 26, 1963, Ser. No. 268,026
7 Claims. (Cl. 325—319)

This invention relates to tuned transistor amplifiers with automatic gain control, and more particularly to an emitter coupled transistor amplifier with improved automatic gain control characteristics.

Receivers for amplitude modulated signals commonly include an automatic gain control system which keeps the output of the receiver relatively constant despite variations in signal strength at the receiver's antenna. The automatic gain control system makes it possible to tune from weak signals to strong signals without having the sound become inordinately loud. The contrast of a television picture is likewise maintained more nearly constant when tuning between signals of different strength. Fading due to atmospheric changes or other conditions affecting propagation is also reduced by automatic gain control.

Some problems have been encountered in applying automatic gain control to tuned transistor amplifiers for high frequency and ultra high frequency applications such as television receivers. The most commonly used circuits employ a grounded emitter configuration with AGC voltage applied to the base of the transistor to control its D.C. emitter current and thereby control its power gain. However, at the low and high extremes of the range of gain values required for AGC, the common emitter amplifier is likely to exhibit non-linear operation, and this produces undesirable distortion and cross-modulation. More specifically, the dynamic transfer characteristic curve for the transistor in the common emitter configuration is a combination of the exponential transconductance characteristic and the relatively linear current gain characteristic, resulting in a non-linear transfer characteristic, if input and output impedances are matched. AGC action varies the operating point such that at the extreme gain settings, the change of base current produced by the input signal may be quite large in comparison to the gradual curvature of the transfer characteristic curve, thus producing distortion.

Accordingly, it is one object of this invention to provide a gain-controlled transistor amplifier which has improved signal linearity over the full range of gain settings.

The stability of a transistor amplifier is also an important consideration. Internal feedback voltage aids the input voltage to the amplifier, and if the feedback voltage is large enough, the transistor will oscillate. The feedback voltage increases as frequency increases, and in high frequency amplifiers, such as those used in the R.F. and I.F. stages of radio and television receivers, neutralization by means of external feedback is often required to prevent oscillation. This complicates the circuitry, and also decreases the bandwidth of the amplifier which is particularly undesirable for television, communication, and other high frequency applications.

There is considerable interest at the present time in integrated circuits; that is, circuits which are built into a single package or module, and in some cases in a single piece of semiconductor material. Common emitter amplifiers require a relatively large emitter bypass capacitor. Capacitance can be provided in integrated structures by a junction in the semiconductor material, or by means of a thin insulating film with metallized contacts. However, the conventional emitter bypass capacitor becomes too large at low I.F. frequencies to be fabricated readily by these techniques. It would be desirable to have a transistor amplifier which is more adaptable to integrated circuit fabrication and also has improved AGC and bandwidth characteristics as previously discussed.

It is an object of this invention to provide a gain-controlled transistor amplifier for AM modulation receivers which does not require neutralization.

Another object of the invention is to provide a gain-controlled transistor amplifier which lends itself readily to integrated circuit fabrication.

A feature of the invention is the provision of an AM modulation receiver with a gain-controlled transistor amplifier including two emitter-coupled transistors connected as a common collector, common base pair, and with an automatic gain control circuit providing a common mode input to the transistors so as to provide a wide range of gain control with excellent signal linearity throughout the range.

Another feature of the invention is a gain-controlled transistor amplifier of the common collector, common base configuration which requires no neutralization and yet is highly stable due to the absence of Miller effect in this configuration.

Another feature is a tuned transistor amplifier of the emitter-coupled type which does not become detuned by AGC action.

A further feature is the relatively low capacitance required to bypass the degenerative portion of the emitter-coupled transistor amplifier compared to that required for the usual common emitter amplifier, thereby facilitating fabrication of the amplifier as an integrated circuit.

A gain-controlled transistor amplifier in accordance with the invention may be employed as a radio frequency stage or an intermediate frequency stage in an amplitude modulation receiver. Particularly in high frequency equipment there has been a need for a transistor amplifier which exhibits improved automatic gain control characteristics.

The gain-controlled transistor amplifier of this invention includes two transistors with their emitters connected together and each connected to a resistance which provides a common current supply path to the emitters. One of the transistors is connected in the common collector configuration and the other is connected in the common base configuration. Input signals are supplied to the base of the common collector stage and output signals are taken from the collector of the common base stage. Automatic gain control voltage is fed to the common emitter resistor of the two transistors. Thus, signals supplied to the amplifier are fed differentially and vary the emitter current of one transistor relative to the other, whereas the automatic gain control voltage is a common mode input and changes the emitter current of both transistors in the same sense.

The forward transfer characteristic curve of the amplifier has a linear transition region from cutoff to saturation with sharp breakpoints at both ends of the transition. Changing the gain of the amplifier changes the slope of the transition, but does not decrease its linearity.

The amplifier exhibits linear behavior over a wide range of gain settings, and this is a feature of considerable importance since distortion and cross-modulation are minimized, and the input dynamic range remains constant.

The common emitter resistance furnishes a large amount of negative feedback. Also, the capacitances through which energy is fed back in the common collector, common base configuration are not affected by the amplification of the transistors, as is the case in the common emitter configuration. As a result, the emitter-coupled amplifier is very stable and has increased bandwidth as compared to commonly used configurations. The common mode gain can also be made low to decrease bypass capacitance requirements over the usual common emitter amplifier, and this facilitates fabricating the amplifier in the form of an integrated circuit.

Figure 1:
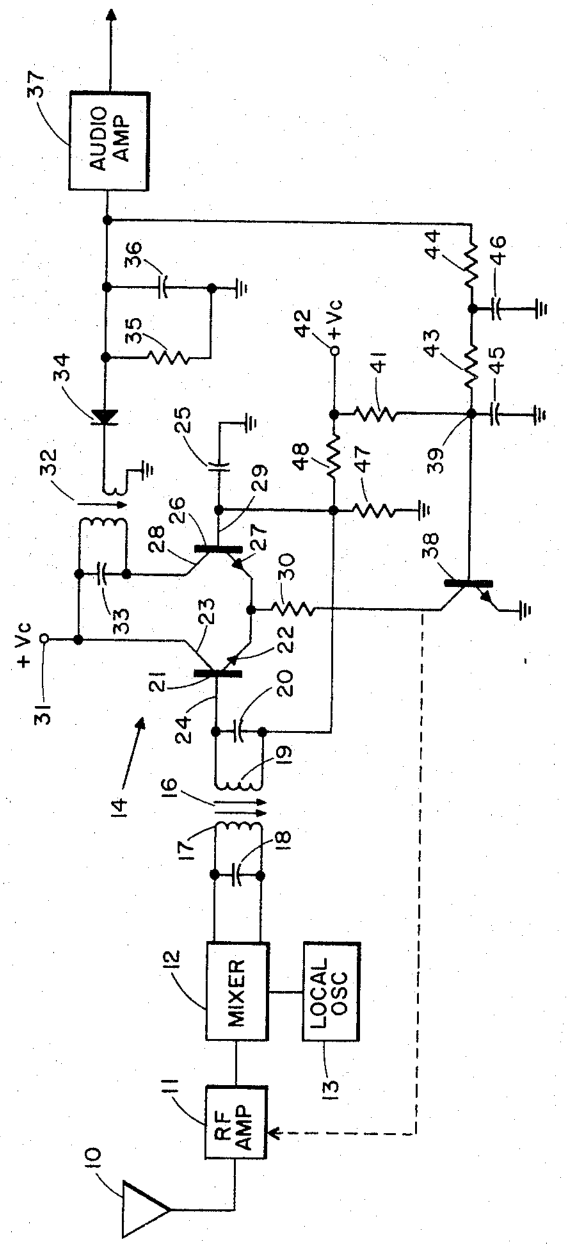
FIG. 1 is a block diagram of a radio receiver showing in schematic form an emitter-coupled transistor amplifier serving as an intermediate frequency stage and a detector supplying automatic gain control voltage to the transistor amplifier.

Referring to the drawings, FIG. 1 is a schematic diagram, partly in block form, showing a radio receiver which includes an emitter-coupled transistor amplifier with automatic gain control in accordance with the invention. The receiver includes an antenna 10, a radio frequency amplifier stage 11, and a mixer stage 12 with a local oscillator 13. Signals received at the antenna 10 are amplified in stage 11 and converted to a fixed intermediate frequency in the mixer stage 12 by the usual heterodyning action. The signals are supplied to an intermediate frequency amplifier stage 14 through a transformer 16 with a primary winding 17 tuned by a capacitor 18 and a secondary winding 19 tuned by capacitor 20.

The intermediate frequency amplifier 14 includes two transistors 21 and 26 connected in a common collector, common base configuration. Transistor 21 of the common collector stage has an emitter 22 connected to a resistor 30 and a collector 23 connected to a terminal 31 which receives positive direct current supply voltage. The input signals to the intermediate frequency amplifier stage are supplied to the base 24 of transistor 21.

The emitter 27 of transistor 26 is connected to the emitter 22 of transistor 21 and also to the resistor 30. The resistor 30 serves as a common current supply path to the emitters of transistors 21 and 26. The bias voltage at the bases of transistors 21 and 26 is established by a voltage divider formed by resistors 47 and 48 which are connected to a supply voltage terminal 42 at which positive voltage appears. The direct current potential at terminal 31 is applied to the collector 28 of transistor 26 through the primary winding of a transformer 32 which couples the amplifier 14 to a detector diode 34. The primary winding of the transformer 32 is tuned by a capacitor 33. The base 29 of transistor 26 is A.C. coupled to ground by a capacitor 25. Thus, input signals are supplied to the base of transistor 21 differentially with respect to ground at the base 29 of transistor 26. The audio component of the output signal is detected by the diode 34 together with the filter formed by resistor 35 and capacitor 36, and the audio signal is supplied to the audio amplifier 37.

The transistor 38 provides an AGC input for controlling the emitter current of the two transistors 21 and 26 of the amplifier 14. The emitter-to-collector path of transistor 38 is connected between the common emitter resistor 30 and ground, and the base of transistor 38 is connected to a summing point 39. The summing point is connected through a resistor 41 to the supply voltage terminal 42 and is coupled to the output of the detector diode 34 by a filtering network formed by resistors 43, 44 and capacitors 45, 46. The transistor 38 is biased for conduction by the positive voltage supplied from terminal 42. As the negative voltage derived from the detector increases, the conduction of transistor 38 decreases, thereby reducing the emitter current of transistors 21 and 26. Thus, the AGC input varies the current of transistors 21 and 26 in the same sense, whereas the input signal varies the current of these transistors in an opposite sense.

The AGC voltage may also control the gain of the radio frequency amplifier 11, and it will be understood that the emitter coupled configuration employed in the intermediate frequency amplifier 14 may also be used in the radio frequency amplifier stage 11. As previously mentioned, the emitter coupled amplifier with automatic gain control is useful in many applications, and is not restricted to the radio receiver shown in FIG. 1.

Figure 2:
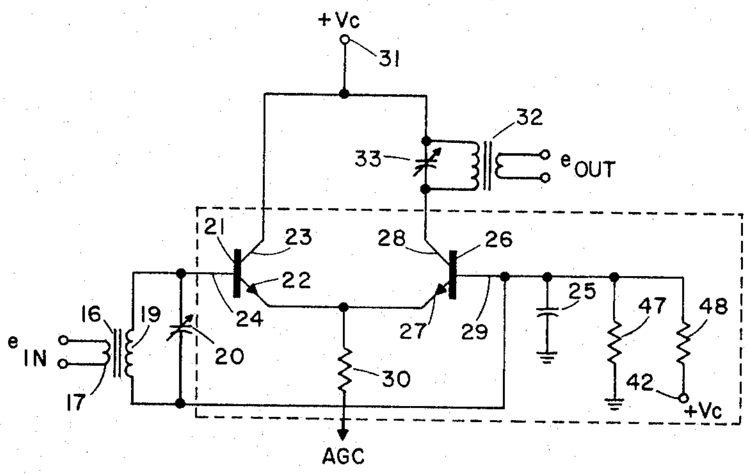
FIG. 2 is a schematic diagram of the emitter-coupled amplifier included in the receiver of FIG. 1.

The operation and characteristics of the emitter coupled amplifier will be described further with reference to FIGS. 2 and 3. The circuit configuration of FIG. 2 is the same as the intermediate frequency amplifier stage 14 of FIG. 1, and therefore the same reference numerals are applied to like components. The common collector transistor 21 provides a low impedance input to the emitter of the common base transistor 26. Since the coupling is from the emitter of the common collector transistor to the emitter of the common base transistor, the gain of the circuit depends critically on the internal emitter resistances of the transistors. The emitter resistance of each transistor increases with a reduction in emitter current in accordance with the following equation:

$$r_e = \frac{KT}{q I_E}$$

where:

$K$=Boltzman's constant
$T$=temperature in degrees Kelvin
$q$=charge in coulombs
$I_E$=D.C. emitter current The small signal voltage gain is also affected by emitter resistance in accordance with the following formula:

$$V_G = \frac{R_L}{r_{e1} + r_{e2} + \frac{r_{b1}}{h_{fe}} + \frac{r_{b2}}{h_{fe}}}$$

where:

$R_L$=output load resistance
$r_b$=base spreading resistance
$h_{fe}$=common emitter current gain Since the resistor 30 is common to both transistors, emitter current $I_E$ is varied equally in both transistors with changes in the automatic gain control input. This results in equal changes of emitter resistance in transistors 21 and 26. However, since the input signal is fed to the base 24 of transistor 21 with respect to the base 29 of transistor 26, the emitter current of transistor 21 becomes unbalanced with respect to the emitter current of transistor 26 causing the emitter resistance $r_e$ to increase in one transistor and decrease in the other transistor. Although the change of emitter resistance is a hyperbolic function, $r_{e1}$ decreases hyperbolically and $r_{e2}$ increases hyperbolically and vice versa. Consequently, the sum of $r_{e1}$ and $r_{e2}$ remains more nearly constant than either of them alone. The result is that the amplifier has improved linearity over a wide range of output voltages.

Figure 3:
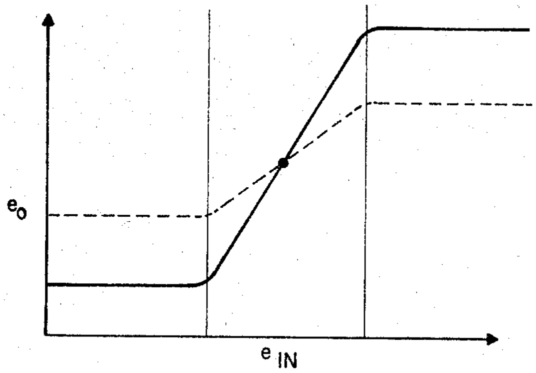
FIG. 3 is a graph showing the forward transfer characteristic of the amplifier of FIG. 2.

The linearity of the amplifier is indicated by the forward transfer characteristic which is plotted in FIG. 3. The solid line curve in FIG. 3 has a linear transition region extending from cutoff to saturation with very sharp knees at both ends of the transition. If the gain of the amplifier is varied, the effect is to change the slope of the transition as indicated by the dashed-line curve in FIG. 3, but a high degree of linearity is maintained. This means that the amplifier exhibits good signal linearity over a wide range of gain settings. From FIG. 3 it may be seen that the dynamic input range remains constant over the range of automatic gain control; i.e., the knees of the curves remain at the same input voltages. Consequently, the amplifier has the same signal handling capability at low gain settings as at high gain settings.

Figure 4:
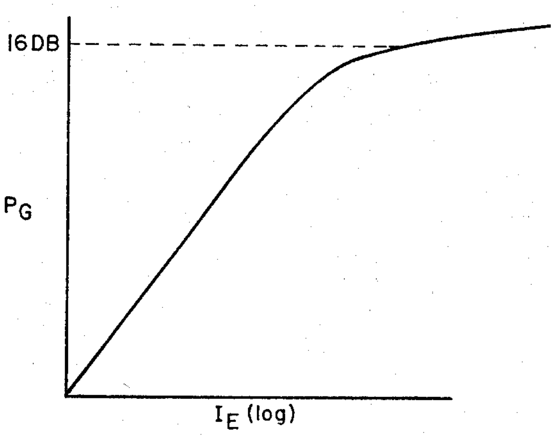
FIG. 4 shows the power gain versus emitter current characteristic curve of the amplifier.

FIG. 4 is a plot of power gain $P_G$ in decibels versus total emitter current $I_E$ and indicates the high degree of linearity of control of the gain characteristic. This plot is for an emitter coupled amplifier in accordance with FIG. 2.

The degree of isolation between the common mode AGC input and the signal input is quite high. At the low frequency of the AGC voltage (almost D.C.) both of the transistors 21 and 26 operate effectively in the common collector configuration. The common mode gain can be made low, such that bypassing at the base 29 of transistor 26 becomes less critical and less sensitive to feedback and noise. Consequently, the portion of the circuit shown within the dashed line in FIG. 2 can be readily fabricated in integrated form. The two transistors, the emitter resistance 30, the bypass capacitor 25 and the resistors 47 and 48 may all be fabricated with a single crystal element of semiconductor material in accordance with known semiconductor fabrication techniques. In an integrated circuit of this type, the two transistors are fabricated by the same processing and thus their characteristics are inherently matched. This improves the D.C. stability and tracking characteristics of the circuit. Even if separate transistor chips are employed, they may be taken from the same wafer and will, therefore, be properly matched.

The following values for the circuit of FIG. 2 are given only as examples. These particular values are for a 200 megacycle R.F. amplifier.

*200 mc. R.F. Amplifier*

| | |
|---|---|
| Transistors **21** and **26** | Small geometry NPN silicon type. |
| Capacitor **20** | 3–30 pf. |
| Capacitor **25** | 1000 pf. |
| Capacitor **33** | 2–8 pf. |
| Resistor **30** | 1 kilo-ohm. |
| Resistor **47** | 4.7 kilo-ohms. |
| Resistor **48** | 8.2 kilo-ohms. |
| Transformer **16** | 2 turns #16 wire ⅜" diam. |
| Transformer **32** | 4 turns #16 wire ⅜" diam. |
| $V_C$ at terminal **31** and **42** | + 12 volts. |
| Input voltage—dynamic range | 120 mv. minimum. |
| AGC voltage range | 0 to +4.5 volts. |

Another advantage of the circuit is the increased bandwidth and freedom from neutralization. This is due to the absence of Miller effect in the common collector, common base configuration. Stated another way, the amplifier has extremely low reverse admittance such that neutralization is not required. The emitter coupled amplifier has been operated successfully at a frequency of 200 megacycle with a constant bandwidth within tolerances of plus or minus .05% over the AGC range. It is significant that the amplifier does not become detuned by AGC, and this is another advantage of the emitter-coupled amplifier over the usual common emitter amplifier.

It is apparent from the foregoing description that the gain-controlled amplifier of the invention has several advantages. The amplifier offers wide gain control and exhibits exceptional signal linearity at all gain settings. The amplifier has an extended bandwith, does not require neutralization, and does not become detuned by AGC. The amplifier lends itself to fabrication by integrated circuit techniques; partly because the bypassing requirements at the degenerative portion of the amplifier are not critical. Integrated circuit amplifiers of this type may be provided as standard modules, and very little design effort is required to incorporate the amplifier in a receiver, particularly since the amplifier need not be neutralized due to its inherent stability.

I claim:

1. In a superheterodyne receiver having an automatic gain control system providing a voltage variable with the strength of received signals, an emitter coupled transistor amplifier controlled by said automatic gain control system and including in combination, a current source, potential supply means, first transistor means having an emitter connected to said current source and a collector connected to said potential supply means, said first transistor means having a base providing a signal input for said amplifier, second transistor means having an emitter connected to the emitter of said first transistor means and to said current source, said second transistor means further having a collector and a base, transformer means having a winding connected between the collector of said second transistor means and said potential supply means providing a signal output for said amplifier, means A.C. coupling said base of said second transistor means to a point of fixed reference potential, and means responsive to the voltage of said automatic gain control system for varying the emitter current of said first and second transistor means for thereby varying the gain of said amplifier.

2. In a superheterodyne receiver having amplifying stages, a detector, and an automatic gain control circuit for controlling the output of said receiver responsive to variations in the amplitude of carrier waves received by said receiver, a high frequency amplifier controlled by said automatic gain control circuit and including in combination, a current source, potential supply means, first transistor means having an emitter connected to said current source and a collector connected to said potential supply means, said first transistor means further having a base providing an input for said amplifier so that said first transistor means has a common collector configuration, second transistor means having an emitter connected to the emitter of said first transistor means and to said current source, transformer means having a winding connected between said potential supply means and said collector of said second transistor means, means A.C. coupling the base of said second transistor means to a point of reference potential so that said second transistor means has a common base configuration, and means connecting said automatic gain control circuit between the emiter and base of said first transistor means and between the emitter and base of said second transistor means for controlling the gain of said amplifier.

3. In a superheterodyne receiver having amplifying stages, a detector, and an automatic gain control circuit for controlling the output of said receiver responsive to variations in the amplitude of carrier waves received by said receiver, a high frequency amplifier controlled by said automatic gain control circuit and including in combination, a current source, potential supply means, first transistor means having an emitter connected to said current source and a collector connected to said potential supply means, said first transistor means further having a base providing an input for said amplifier so that said first transistor means has a common collector configuration, second transistor means having an emitter, a base and a collector, said emitter connected to the emitter of said first transistor means and to said current source, first transformer means having a winding connected between said base of said first transistor means and said base of said second transistor means, means tuning said winding to a signal frequency, second transformer means having a winding connected between said potential supply means and said collector of said second transistor means, means tuning said winding of said second transformer means to a signal frequency, means A.C. coupling the base of said second transistor means to a point of reference potential so that said second transistor means has a common base configuration, and means connecting said automatic gain control circuit between the emitter and base of said first transistor means and between the emitter and base of said second transistor means for controlling the gain of said amplifier.

4. In an amplitude modulation receiver having an automatic gain control system providing a voltage variable with the strength of received signals, an emitter coupled transistor amplifier controlled by said automatic gain control system and including in combination, a current source, potential supply means, first and second transistor means matched to each other and having substantially the same emitter resistance characteristics, said first and second transistor means each having an emitter, a base and a collector, said emitters of said first and second transistor means connected together at a common terminal, resistance means connected to said common terminal, means connecting said resistance means to said current source for providing a common current supply path to the emitters of said transistor means, first transformer means having a winding connected between the base of said first transistor means and the base of said second transistor means for providing a signal input to said amplifier, second transformer means having a winding connected between said potential supply means and the collector of said second transistor means providing a signal output for said amplifier, means connecting the collector of said first transistor means to said potential supply means so that said first transistor means has a common collector configuration, means A.C. coupling the base of said second transistor means to a point of reference potential so that said second transistor means has a common base configuration, and means responsive to the voltage of said automatic gain control system for controlling the emitter current of said first and second transistor means to thereby vary the gain of said amplifier, with said amplifier exhibiting a high degree of signal linearity over the full range of gain control and having low reverse admittance such that neutralization of said amplifier is not required.

5. An emitter coupled transistor amplifier having improved automatic gain control characteristics, said amplifier comprising a current source, potential supply means, first and second transistor means matched to each other and having substantially the same emitter resistance characteristics, said first transistor means having an emitter connected to said current source and a collector connected to said potential supply means, and further having a base providing a signal input for said amplifier, said second transistor means having a collector and a base and further having an emitter connected to said current source and to said emitter of said first transistor means, signal output coupling means connected to said collector of said second transistor means and to said potential supply means to form an output for said amplifier, diode detection means coupled to said signal output coupling means for providing a gain control voltage inversely proportional to a change in level of an input signal applied to said first and second transistor means, and means connecting said diode detection means to said current source for decreasing the current therethrough in response to a change in voltage at said diode detection means, thereby simultaneously decreasing the current flow in said first and second transistor means, said amplifier having a wide bandwidth and a high degree of signal linearity over the full range of automatic gain control, and having a low reverse admittance such that neutralization of said amplifier is not required.

6. An emitter coupled transistor amplifier having improved automatic gain control characteristics, said amplifier comprising a current source, potential supply means, first transistor means having an emitter connected to said current source and a collector connected to said potential supply means, said first transistor means having a base providing a signal input, second transistor means having an emitter connected to the emitter of said first transistor means and to said current source, said second transistor means, further having a collector and a base, first transformer means having a winding connected between said base of said first transistor means and said base of said second transistor means, means tuning said winding of said first transformer means to a signal frequency, second transformer means having a winding connected between the collector of said second transistor means and said potential supply means providing a signal output for said amplifier, means tuning said winding of said second transformer means to a signal frequency, means A.C. coupling said base of said second transistor means to a point of reference potential, and said current source connected to the emitters of said first and second transistor means for varying the emitter current of said first and second transistor means to thereby provide automatic gain control of said first and second transistor means.

7. An emitter coupled transistor amplifier including in combination, a current source, potential supply means, first and second transistor means matched to each other and having substantially the same emitter resistance characteristics, said first and second transistor means each having an emitter, a base and a collector, said emitters of said first and second transistor means connected to a common terminal, resistance means connected to said common terminal, first transformer means having a winding connected between the base of the first transistor means and the base of the second transistor means for providing a signal input to said amplifier, second transformer means having a winding connected between said potential supply means and the collector of said second transistor means providing a signal output for said amplifier, means connecting the collector of said first transistor means to said potential supply means so that said first transistor means has a common collector configuration, means A.C. coupling the base of said second transistor means to a point of reference potential so that said second transistor means has a common base configuration, means connecting said resistance means to said current source, and means connected between the emitters and bases of said first and second transistor means for controlling the emitter current of said first and second transistor means to thereby provide automatic gain control of said amplifier.

References Cited by the Examiner

UNITED STATES PATENTS 3,144,564 8/1964 Sikorra.

KATHLEEN H. CLAFFY, *Primary Examiner.*

R. LINN, *Assistant Examiner.*